United States Patent
Seo

(10) Patent No.: US 12,213,246 B2
(45) Date of Patent: *Jan. 28, 2025

(54) ELECTRONIC DEVICE INCLUDING FLEXIBLE PRINTED CIRCUIT BOARD

(71) Applicant: Samsung Electronics Co., Ltd., Suwon-si (KR)

(72) Inventor: Seonghun Seo, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 18/594,754

(22) Filed: Mar. 4, 2024

(65) Prior Publication Data

US 2024/0206055 A1 Jun. 20, 2024

Related U.S. Application Data

(63) Continuation of application No. 17/569,851, filed on Jan. 6, 2022, now Pat. No. 11,930,592, which is a
(Continued)

(30) Foreign Application Priority Data

Jul. 26, 2019 (KR) ........................ 10-2019-0091208

(51) Int. Cl.
*H05K 1/02* (2006.01)
*H01R 12/79* (2011.01)
(Continued)

(52) U.S. Cl.
CPC .......... *H05K 1/0281* (2013.01); *H01R 12/79* (2013.01); *H05K 1/148* (2013.01); *H05K 1/189* (2013.01);
(Continued)

(58) Field of Classification Search
CPC ...... H05K 1/0281; H05K 1/148; H05K 1/189; H05K 5/0017; H05K 2201/093; H05K 2201/10189; H01R 12/79
(Continued)

(56) References Cited

U.S. PATENT DOCUMENTS 7,384,272 B2 6/2008 Na
9,401,532 B2 7/2016 Tago et al.
(Continued)

FOREIGN PATENT DOCUMENTS

JP H06-152077 A 5/1994
JP H06-216533 A 8/1994
(Continued)

OTHER PUBLICATIONS

European Search Report dated Aug. 12, 2022, issued in European Application No. 20847536.8.
(Continued)

*Primary Examiner* — Andargie M Aychillhum
(74) *Attorney, Agent, or Firm* — Jefferson IP Law, LLP

(57) ABSTRACT

An electronic device is provided. The electronic device includes a flexible printed circuit board comprising a housing, a first printed circuit board disposed in an inner space of the housing, a second printed circuit board disposed so as to be spaced apart from the first printed circuit board, a connection part electrically connecting the first printed circuit board and the second printed circuit board and connected to the second printed circuit board, and a coupling part including a bent part extending from the connection part and capable of being at least partially bent.

16 Claims, 8 Drawing Sheets

Related U.S. Application Data continuation of application No. PCT/KR2020/007022, filed on May 29, 2020.

(51) Int. Cl.
*H05K 1/14* (2006.01)
*H05K 1/18* (2006.01)
*H05K 5/00* (2006.01)

(52) U.S. Cl.
CPC ..... *H05K 5/0017* (2013.01); *H05K 2201/093* (2013.01); *H05K 2201/10151* (2013.01); *H05K 2201/10189* (2013.01); *H05K 2201/2009* (2013.01)

(58) Field of Classification Search
USPC ........................................................ 361/749
See application file for complete search history.

(56) References Cited

U.S. PATENT DOCUMENTS

| | | | |
|---|---|---|---|
| 11,930,592 B2* | 3/2024 | Seo | ............... H05K 1/147 |
| 2005/0040504 A1 | 2/2005 | Kang et al. | |
| 2007/0281499 A1 | 12/2007 | Muro et al. | |
| 2009/0261778 A1 | 10/2009 | Kook | |
| 2012/0133458 A1 | 5/2012 | Kato et al. | |
| 2012/0235764 A1 | 9/2012 | Kang et al. | |
| 2013/0083505 A1 | 4/2013 | Kobayashi | |
| 2015/0042421 A1 | 2/2015 | Kato | |
| 2015/0195900 A1 | 7/2015 | Wakabayashi et al. | |
| 2015/0351222 A1 | 12/2015 | Baba et al. | |
| 2016/0037623 A1 | 2/2016 | Fjelstad | |
| 2020/0098793 A1* | 3/2020 | Kim | ............... G06F 3/044 |
| 2020/0111814 A1 | 4/2020 | Bae et al. | |
| 2020/0375026 A1 | 11/2020 | Shim et al. | |

FOREIGN PATENT DOCUMENTS

| | | |
|---|---|---|
| KR | 10-2017-0005579 A | 1/2017 |
| WO | 2015/015959 A1 | 2/2015 |

OTHER PUBLICATIONS

Korean Office Action dated Feb. 23, 2024 issued in Korean Patent Application No. 10 2019 0091208.

* cited by examiner

ELECTRONIC DEVICE INCLUDING FLEXIBLE PRINTED CIRCUIT BOARD

CROSS-REFERENCE TO RELATED APPLICATION(S)

This application is a continuation application of prior application Ser. No. 17/569,851, filed on Jan. 6, 2022, which is a continuation application, claiming priority under § 365(c), of an International application No. PCT/KR2020/007022, filed on May 29, 2020, which is based on and claims the benefit of a Korean patent application number 10-2019-0091208, filed on Jul. 26, 2019, in the Korean Intellectual Property Office, the disclosure of which is incorporated by reference herein in its entirety.

BACKGROUND

1. Field

The disclosure relates to an electronic device including a flexible printed circuit board. More particularly, the disclosure relates to a flexible printed circuit board, which includes a connection part connected to a printed circuit board, and a linkage part extended from the connection part and including a bending portion being at least partially bendable.

2. Description of Related Art

An electronic device may include at least one electronic component disposed in the internal space. The at least one electronic component may be disposed to perform a corresponding function at a suitable position in the internal space of the electronic device, and may be generally electrically connected to a first printed circuit board (e.g., a main board). The at least one electronic component may be mounted on a second printed circuit board (i.e., sub-board or flexible board), and may be spaced apart from the first printed circuit board. In this case, the first printed circuit board and the second printed circuit board may be electrically connected through a flexible printed circuit board (FPCB) having a specific length.

The above information is presented as background information only to assist with an understanding of the disclosure. No determination has been made, and no assertion is made, as to whether any of the above might be applicable as prior art with regard to the disclosure.

SUMMARY

The first printed circuit board and the second printed circuit board arranged in the internal space of the electronic device may have different arrangement conditions with respect to each other. For example, when the first printed circuit board and the second printed circuit board are spaced apart from each other, and the gap therebetween is quite small or surrounding electronic components or the housing (e.g., an internal bracket) are disposed nearby, to circumvent this, the flexible printed circuit board may have at least partially an excessively bent portion, and an internal wiring structure of the flexible printed circuit board may be disconnected due to this excessively bent portion. Moreover, if the spacing between the printed circuit boards is widened to prevent disconnection, there may be a problem that goes against the slimming of the electronic device. In addition, when bending is required around conductive terminals of the flexible printed circuit board exposed to the outside in order for the first printed circuit board or the second printed circuit board or the both to be connected with the conductive terminals, the possibility of disconnection of the electrical wiring may be further increased.

Aspects of the disclosure are to address at least the above-mentioned problems and/or disadvantages and to provide at least the advantages described below. Accordingly, an aspect of the disclosure is to provide an electronic device including a flexible printed circuit board.

Another aspect of the disclosure is to provide an electronic device including a flexible printed circuit board that can help secure an efficient mounting space for electronic components by having a flexible structure corresponding to the bent region.

Another aspect of the disclosure is to provide an electronic device including a flexible printed circuit board that is configured to prevent a disconnection problem that may occur due to deformation, such as bending during a connection process with a printed circuit board.

Additional aspects will be set forth in part in the description which follows and, in part, will be apparent from the description, or may be learned by practice of the presented embodiments.

In accordance with an aspect of the disclosure, an electronic device is provided. The electronic device includes a housing, a first printed circuit board disposed in an internal space of the housing, a second printed circuit board disposed to be spaced apart from the first printed circuit board, and a flexible printed circuit board that electrically connects the first printed circuit board and the second printed circuit board, and includes a connection part connected to the second printed circuit board, and a linkage part extended from the connection part and including a bending portion being at least partially bendable, the flexible printed circuit board including a dielectric substrate, a first conductive layer disposed on a first surface of the dielectric substrate, a first cover layer disposed on the first conductive layer, a second conductive layer disposed on a second surface opposite to the first surface of the dielectric substrate, a second cover layer disposed on the second conductive layer, a plurality of first conductive terminals, in the connection part, exposed through the first cover layer and electrically connected to the first conductive layer, and a plurality of second conductive terminals, in the connection part, exposed through the first cover layer, electrically connected to the first conductive layer, and disposed at a greater distance from the bending portion than the plurality of first conductive terminals, wherein the first conductive layer may include, at the bending portion, a cutoff portion at which the first conductive layer is electrically disconnected, and wherein the plurality of second conductive terminals may be electrically connected to the second conductive layer, in the connection part, through at least one conductive via formed through the dielectric substrate.

In Accordance with another aspect of the disclosure, a flexible printed circuit board, which includes a connection part connected to a printed circuit board, and a linkage part extended from the connection part and including a bending portion being at least partially bendable is provided. The flexible printed circuit board includes a dielectric substrate, a first conductive layer disposed on a first surface of the dielectric substrate, a first cover layer disposed on the first conductive layer, a second conductive layer disposed on a second surface opposite to the first surface of the dielectric substrate, a second cover layer disposed on the second conductive layer, a plurality of first conductive terminals, in the connection part, exposed through the first cover layer and electrically connected to the first conductive layer, and a plurality of second conductive terminals, in the connection part, exposed through the first cover layer, electrically connected to the first conductive layer, and disposed at a greater distance from the bending portion than the plurality of first conductive terminals, wherein the first conductive layer may include, at the bending portion, a cutoff portion at which the first conductive layer is electrically disconnected, and wherein the plurality of second conductive terminals may be electrically connected to the second conductive layer, in the connection part, through at least one conductive via formed through the dielectric substrate.

The flexible printed circuit board, according to various embodiments of the disclosure, has a flexible structure applied to correspond to a region requiring bending, so that it is possible to prevent disconnection of electrical wiring that may occur when installing the flexible printed circuit board and it is possible to facilitate efficient mounting of electronic components in the internal space of the electronic device through a structural change of the flexible printed circuit board.

Other aspects, advantages, and salient features of the disclosure will become apparent to those skilled in the art from the following detailed description, which, taken in conjunction with the annexed drawings, discloses various embodiments of the disclosure.

BRIEF DESCRIPTION OF THE DRAWINGS

The above and other aspects, features, and advantages of certain embodiments of the disclosure will be more apparent from the following description taken in conjunction with the accompanying drawings, in which.

Throughout the drawings, like reference numerals will be understood to refer to like parts, components, and structures.

DETAILED DESCRIPTION

The following description with reference to the accompanying drawings is provided to assist in a comprehensive understanding of various embodiments of the disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the disclosure. Accordingly, it should be apparent to those skilled in the art that the following description of various embodiments of the disclosure is provided for illustration purpose only and not for the purpose of limiting the disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

The electronic device, according to various embodiments of the disclosure, disclosed in this document may be of various types of devices. The electronic device may include, for example, a portable antenna module (e.g., a smartphone), a computer device, a portable multimedia device, a portable medical device, a camera, a wearable device, or a home appliance. The electronic device according to an embodiment of the document is not limited to devices to be described later.

Various embodiments of this document and the terms used therein are not intended to limit the technical features described in this document to a specific embodiment, and should be understood to include various modifications, equivalents, or substitutions thereof. In connection with the description of the drawings, similar reference symbols may be used for similar or related components. The singular form of a noun corresponding to an item may include one or multiple instances of the item unless clearly indicated otherwise in a related context. In the document, the expression "A or B", "at least one of A and B", "at least one of A or B", "A, B or C", "at least one of A, B and C", or "at least one of A, B or C" may include any one of the listed items or all possible combinations thereof. The terms "1st" and "2nd" or "first" and "second" may be used to simply distinguish one element from another element, without limiting corresponding elements in another aspect (e.g., importance or order).

Figure 1:
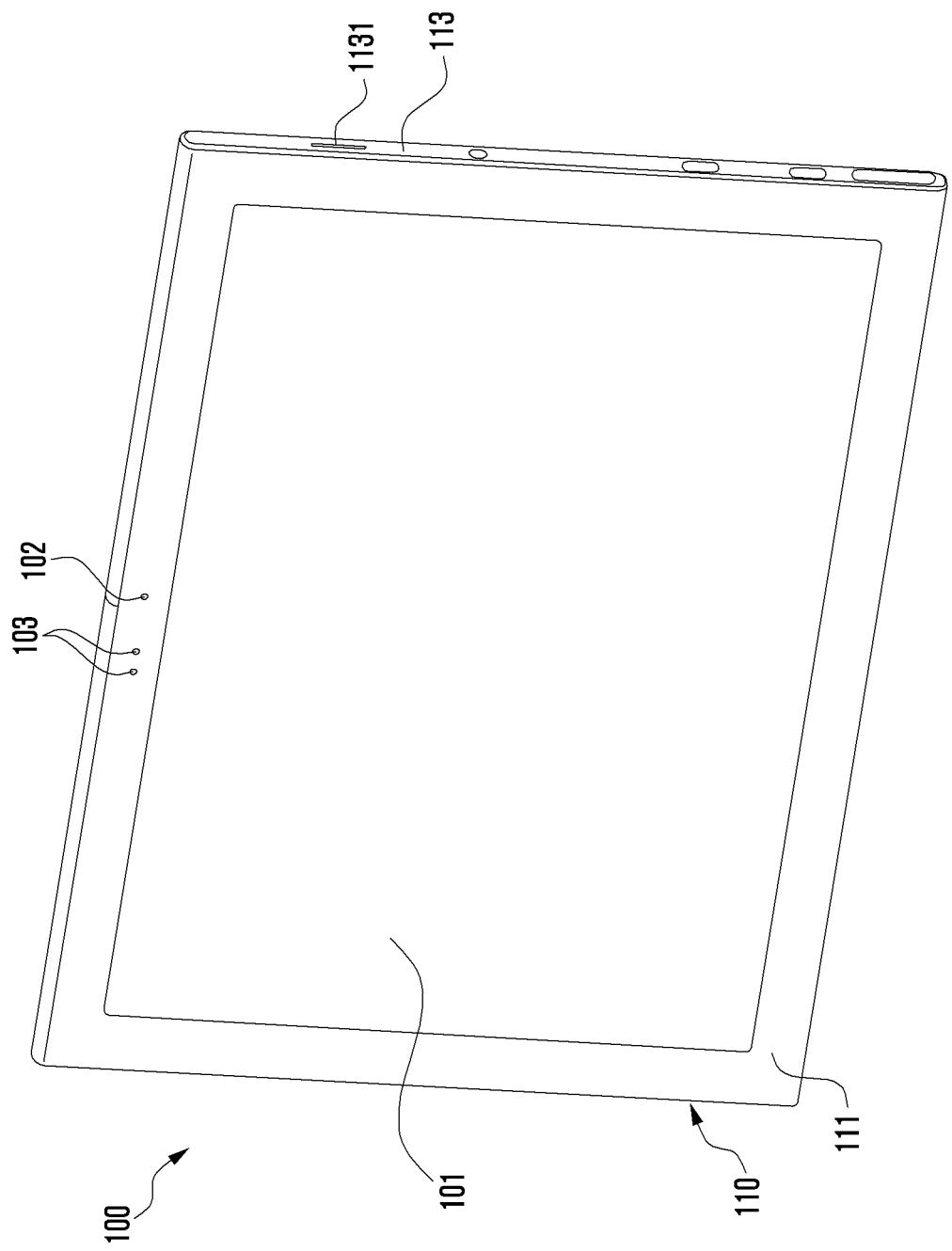
FIG. 1 is a perspective view illustrating a front surface of an electronic device according to an embodiment of the disclosure.
Figure 2:
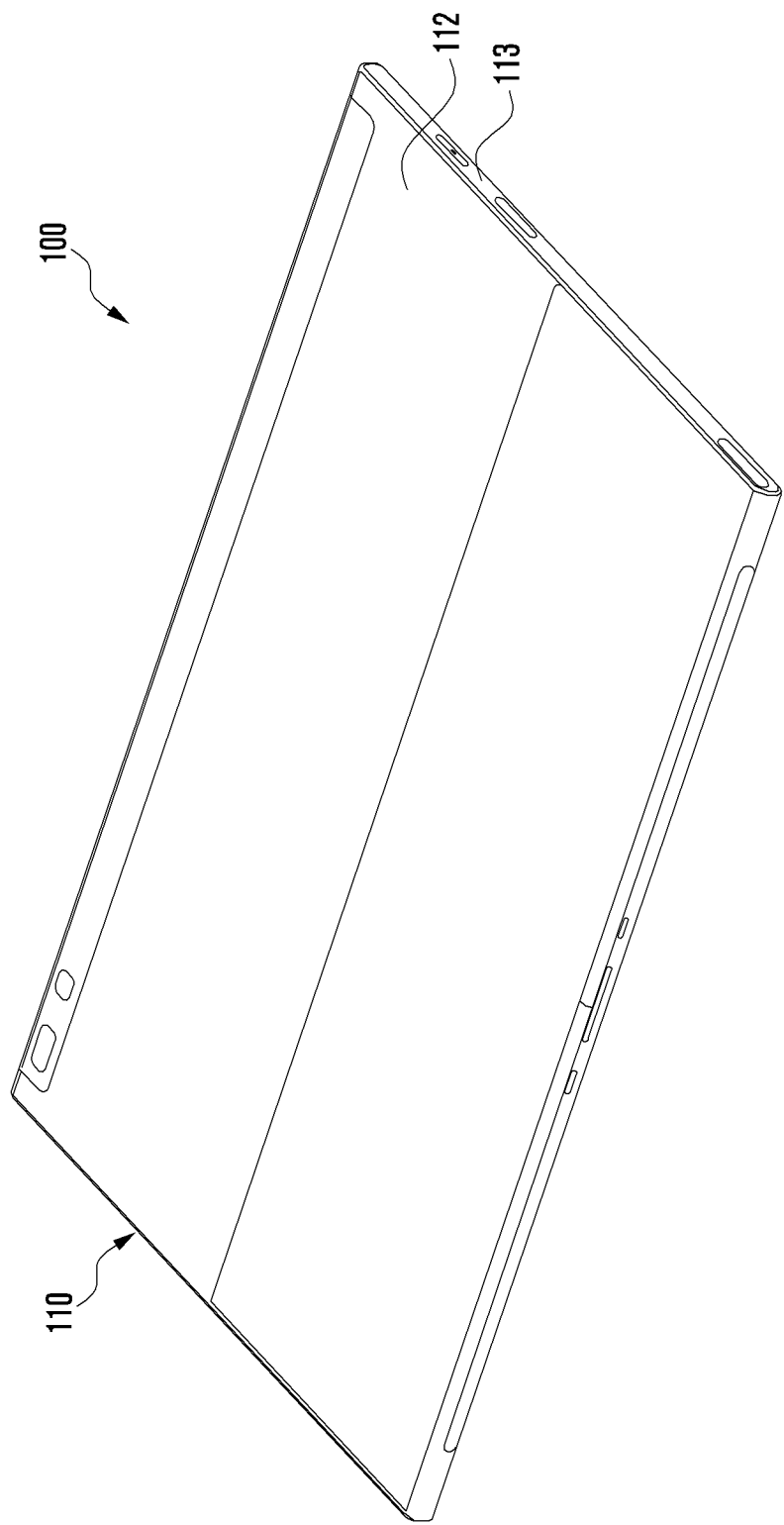
FIG. 2 is a perspective view illustrating a rear surface of an electronic device of FIG. 1 according to an embodiment of the disclosure.

FIG. 1 is a perspective view illustrating a front surface of an electronic device according to an embodiment of the disclosure. FIG. 2 is a perspective view illustrating a rear surface of an electronic device of FIG. 1 according to an embodiment of the disclosure.

Referring to FIGS. 1 and 2, an electronic device 100 may include a front cover 111, a rear cover 112 facing in a direction opposite to the front cover 111, and a housing 110 (e.g., a housing structure) that includes a side member 113 surrounding the internal space (e.g., an internal space 1001 in FIG. 3) between the front cover 111 and the rear cover 112. According to an embodiment of the disclosure, the front cover 111 may be made of a glass plate or polymer plate including various coating layers. According to an embodiment of the disclosure, the rear cover 112 may be made of, for example, coated or tinted glass, ceramic, polymer, or metal (e.g., aluminum, stainless steel (STS), or magnesium), or a combination thereof. According to an embodiment of the disclosure, the side member 113 is coupled to the front cover 111 and the rear cover 112, and may have a side bezel structure including a metal and/or a polymer. In another embodiment of the disclosure, the rear cover 112 and the side member 113 may be integrally formed and may include the same material (e.g., metal material, such as aluminum or magnesium).

Figure 3:
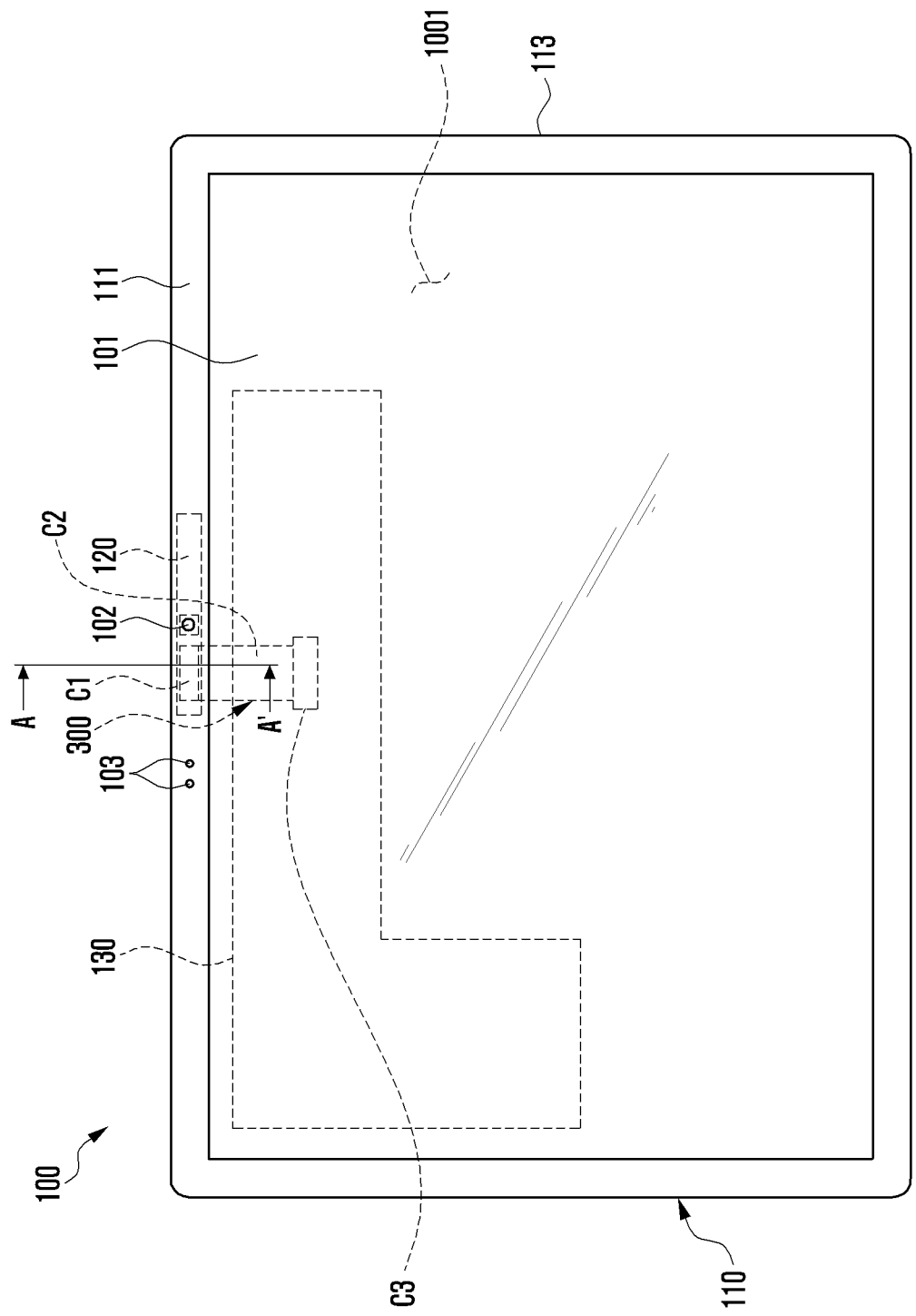
FIG. 3 is a diagram schematically illustrating an arrangement configuration of a flexible printed circuit board in an internal space of an electronic device according to an embodiment of the disclosure.

According to various embodiments of the disclosure, the electronic device 100 may include a display 101, which is arranged to be visible from the outside through at least a portion of the front cover 111, in the internal space thereof (e.g., internal space 1001 in FIG. 3). According to an embodiment of the disclosure, the display 101 may be exposed through, for example, a substantial portion of the front cover 111. In another embodiment of the disclosure, the display 101 may be exposed through substantially the whole area of the front cover 111. In another embodiment of the disclosure, the edge of the display 101 may be formed to be substantially the same as the shape of the adjacent periphery of the front cover 111. In another embodiment of the disclosure, to expand the exposed area of the display 101, the distance between the periphery of the display 101 and the periphery of the front cover 111 may be formed to be substantially the same. In another embodiment of the disclosure, a recess or opening may be formed in some of the screen display area of the display 101, at least one of the above-described components may be disposed to be aligned with the recess or opening in the internal space of the electronic device 100. As another embodiment of the disclosure, the electronic device 100 may include at least one electronic component disposed on the rear surface of the screen display area (e.g., active area) of the display 101 in the internal space (e.g., the internal space 1001 in FIG. 3). According to an embodiment of the disclosure, the at least one electronic component may include at least one of at least one sensor module, at least one camera module, an audio module, a fingerprint sensor, or a light emitting element. In another embodiment of the disclosure, the display 101 may be coupled to or disposed adjacent to a touch detection circuit, a pressure sensor capable of measuring the strength (pressure) of a touch, and/or an electromagnetic induction panel (e.g., a digitizer) for detecting an electronic pen (e.g., a stylus pen) operating in a magnetic field. According to an embodiment of the disclosure, the electronic device 100 may include at least one audio module 1131 (e.g., a speaker device) disposed to be exposed to the outside through at least a portion of the side member 113.

According to various embodiments of the disclosure, the electronic device 100 may include at least one sensor module 103 disposed through at least a portion of the front cover 111 in the internal space (e.g., the internal space 1001 in FIG. 3). According to an embodiment of the disclosure, the at least one sensor module 103 may include at least one of a proximity sensor module, a fingerprint sensor module, a gesture sensor module, a gyro sensor module, a barometric pressure sensor module, a temperature sensor module, a humidity sensor module, a magnetic sensor module, an acceleration sensor module, a grip sensor module, an illuminance sensor module, an infrared sensor module, a color sensor module, an ultrasonic sensor module, an iris sensor module, a biometric sensor module, a time-of-flight (TOF) sensor module, or a light detection and ranging (LiDAR) scanner.

Figure 4:
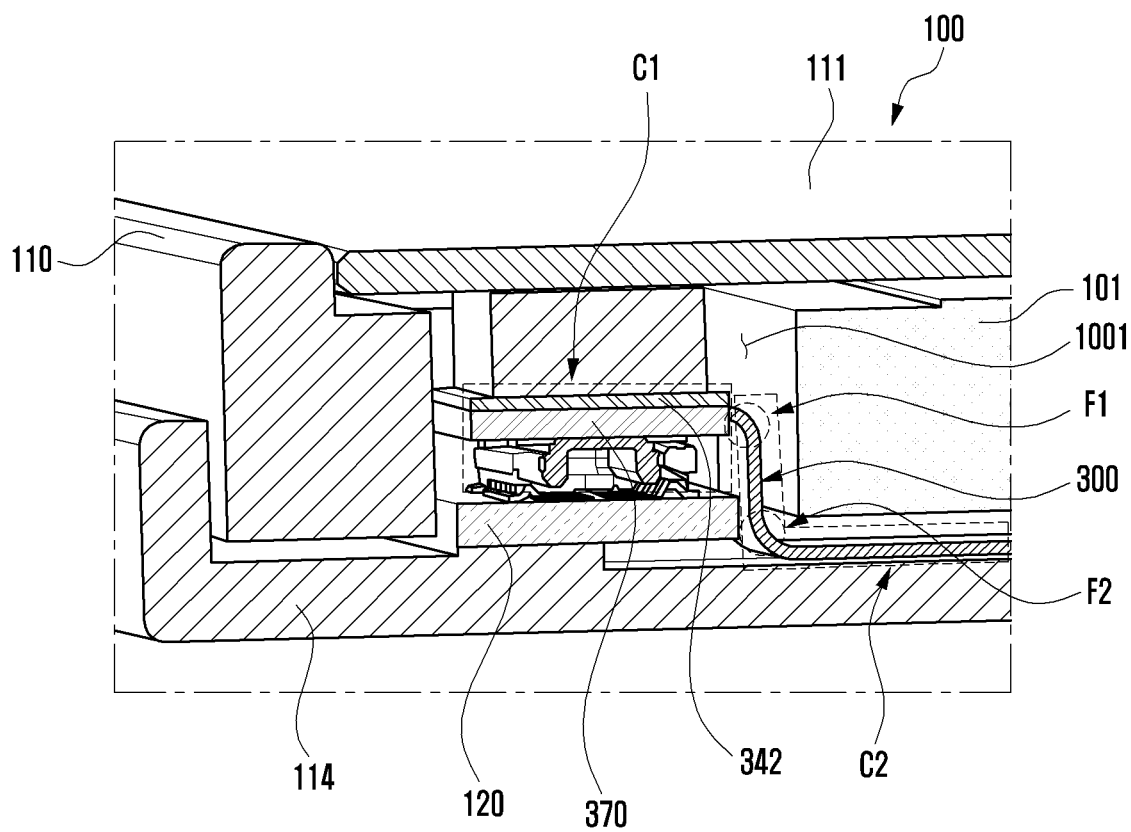
FIG. 4 is a partial cross-sectional view of an electronic device seen along line A-A' in FIG. 3 according to an embodiment of the disclosure.

FIG. 3 is a diagram schematically illustrating an arrangement constitution of a flexible printed circuit board in an internal space of a electronic device according to an embodiment of the disclosure. FIG. 4 is a partial cross-sectional view of an electronic device seen along line A-A' in FIG. 3 according to an embodiment of the disclosure.

Referring to FIGS. 3 and 4, an electronic device may include a first printed circuit board 130 disposed in the internal space 1001. According to an embodiment of the disclosure, the first printed circuit board 130 may include a main printed circuit board of the electronic device 100. According to an embodiment of the disclosure, the electronic device 100 may include at least one camera module 102 for detection an external environment through the front cover 111. According to an embodiment of the disclosure, the at least one camera module 102 may be disposed through a second printed circuit board 120 in the internal space 1001 of the electronic device 100. According to an embodiment of the disclosure, the electronic device 100 may include a flexible printed circuit board (FPCB) 300 that is disposed to electrically connect the second printed circuit board 120 to the first printed circuit board 130.

According to various embodiments of the disclosure, the flexible printed circuit board 300 may include a first connection part C1, which is disposed at one end of the linkage part C2 of a specific length and is electrically connected to the second printed circuit board 120, and a second connection part C3 disposed at the other end and electrically connected to the first printed circuit board 130. According to an embodiment of the disclosure, the flexible printed circuit board 300 may include electrical wiring through conductive layers (e.g., copper foil layers) disposed via a plurality of insulating layers.

According to various embodiments of the disclosure, the electronic device 100 may include a support member 114 disposed in the internal space 1001. According to an embodiment of the disclosure, the support member 114 may be extended from the housing 110 or may be structurally coupled to the housing 110. According to an embodiment of the disclosure, the second printed circuit board 120 may be disposed to be supported at least partially by the support member 114 in the internal space 1001 of the electronic device 100. For example, the second printed circuit board 120 may be disposed at a position that at least partially overlaps the front cover 111 through the support member 114 when the display 101 is viewed from above. According to an embodiment of the disclosure, the flexible printed circuit board 300 may be electrically connected to the second printed circuit board 120 through an electrical connector 370 disposed on the first connection part C1. In this case, the flexible printed circuit board 300 may be provided with a supporting force through a rigidity reinforcing layer 342 (e.g., a stiffener) disposed at a position corresponding to the electrical connector 370 in the first connection part C1.

According to various embodiments of the disclosure, the flexible printed circuit board 300 may be electrically connected to the first printed circuit board 130 by being connected to the first printed circuit board 130 through the linkage part C2 of a specific length extending from the first connection part C1 and the second connection part C3 disposed at the other end. According to an embodiment of the disclosure, the linkage part C2 may include at least one bending portion F1 and F2 that is deformed (bent) based on the mounting space for peripheral electronic components, such as the display 101 disposed in the path to the first printed circuit board 130 in the internal space 1001 of the electronic device 100. According to an embodiment of the disclosure, the degree of bending of the at least one bending portion F1 and F2 may be determined according to the separation distance between the second printed circuit board 120 and the display 101. For example, as the separation distance between the second printed circuit board 120 and the display 101 decreases, the linkage part C2 may be deformed to an excessively bent state, which may result in disconnection of the electrical wiring.

The flexible printed circuit board 300 according to an embodiment of the disclosure may include a flexible structure disposed at the bending portions F1 and F2 of the linkage part C2 to prevent disconnection of electrical wiring due to excessive bending of the at least one bending portion F1 and F2.

Hereinafter, the structure of the flexible printed circuit board 300 will be described below.

Figure 5:
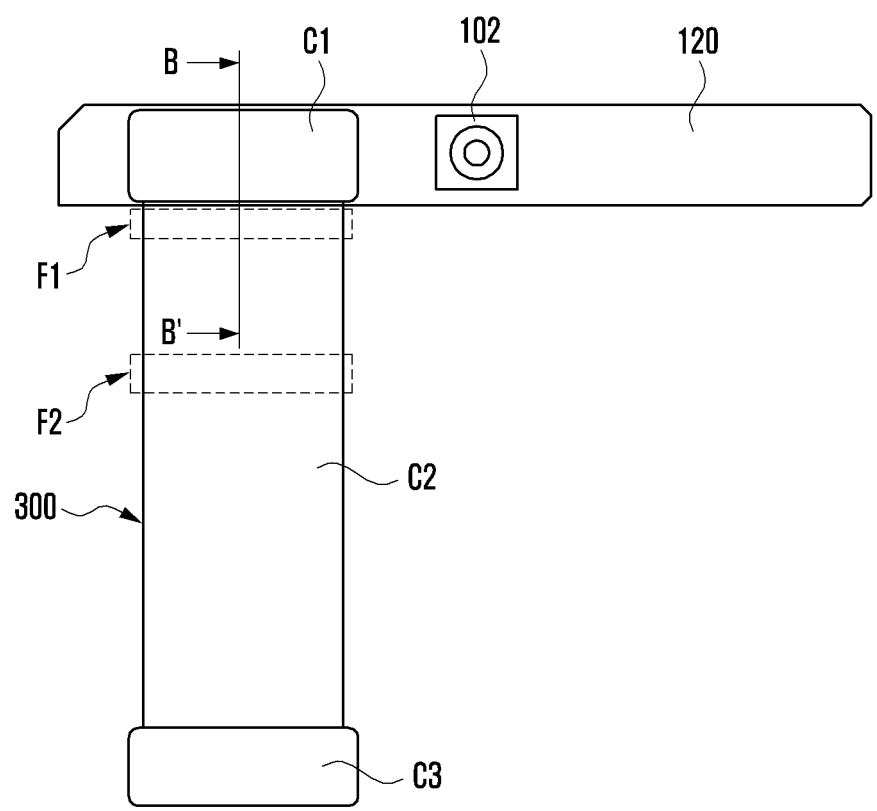
FIG. 5 is a plan view illustrating a state in which a flexible printed circuit board is electrically connected to a second printed circuit board according to an embodiment of the disclosure.
Figure 6A:
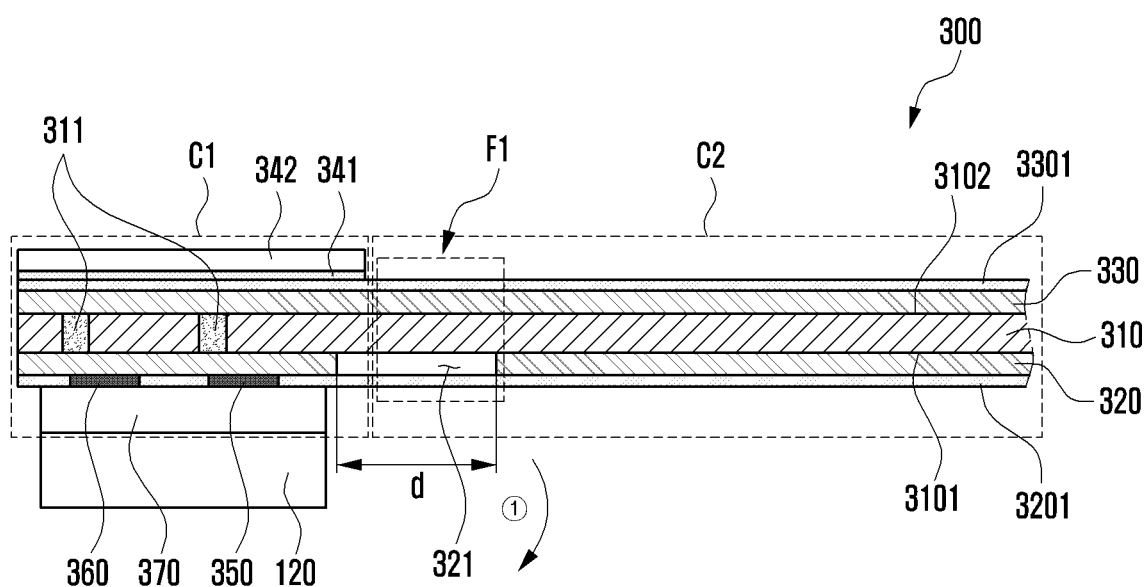
FIG. 6A is a partial cross-sectional view of a flexible printed circuit board seen along line B-B' in FIG. 5 according to an embodiment of the disclosure.
Figure 6B:
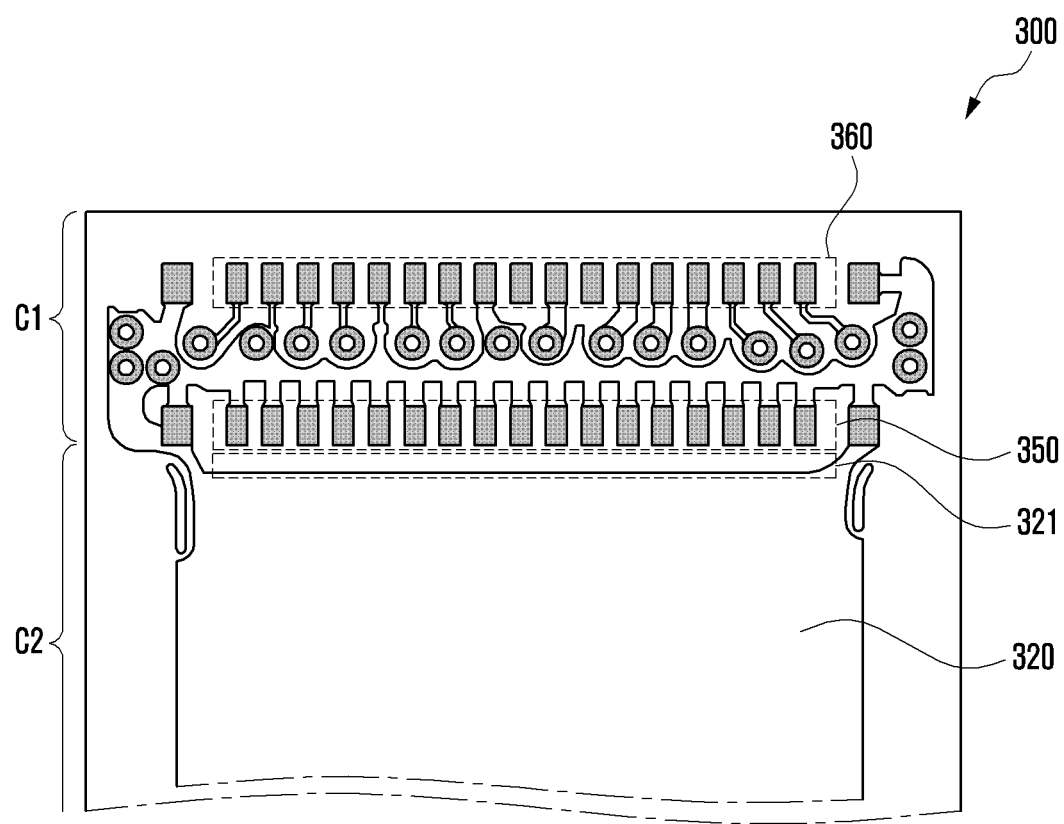
FIG. 6B is a top view of a first connection part and a linkage part of a flexible printed circuit board according to an embodiment of the disclosure.

FIG. 5 is a plan view illustrating a state in which a flexible printed circuit board is electrically connected to a second printed circuit board according to an embodiment of the disclosure. FIG. 6A is a partial cross-sectional view of a flexible printed circuit board seen along line B-B' in FIG. 5 according to an embodiment of the disclosure. FIG. 6B is a top view of a first connection part C1 and a linkage part C2 of a flexible printed circuit board according to an embodiment of the disclosure.

Referring to FIGS. 5 to 6B, the flexible printed circuit board 300 may include a first connection part C1 electrically connected to the second printed circuit board 120 on which the camera module 102 is mounted, a linkage part C2 extended to a specific length from the first connection part C1, and a second connection part C3 disposed at one end of the linkage part C2 and electrically connected to the first printed circuit board 120. According to an embodiment of the disclosure, the flexible printed circuit board 300 may include at least one bending portion F1 and F2 at least partially disposed on the linkage part C2.

According to various embodiments of the disclosure, the flexible printed circuit board 300 may have a multi-layered structure stacked through at least one insulating layer. According to an embodiment of the disclosure, the flexible printed circuit board 300 may be formed in a multilayer structure of two layers, three layers, or more than three layers. According to an embodiment of the disclosure, the flexible printed circuit board 300 may include a dielectric substrate 310 (e.g., a polypropylene glycol (PPG) substrate or polyimide substrate). According to an embodiment of the disclosure, the dielectric substrate 310 may include a first conductive layer 320 disposed on a first surface 3101, and a second conductive layer 330 disposed on a second surface facing in a direction opposite to the first surface. According to an embodiment of the disclosure, the flexible printed circuit board 300 may include a first cover layer 3201 stacked on the first conductive layer 320, and a second cover layer 3301 stacked on the second conductive layer 330.

According to various embodiments of the disclosure, the flexible printed circuit board 300 may include a plurality of first conductive terminals 350 exposed through the first cover layer 3201 in the first connection part C1. According to an embodiment of the disclosure, the flexible printed circuit board 300 may include a plurality of second conductive terminals 360 that are exposed through the first cover layer 3201, are electrically connected to the first conductive layer 320, and are disposed farther from the first bending portion F1 than the plurality of first conductive terminals 350 in the first connection part C1. Each of the plurality of conductive terminals 350 and 360 may be exposed to the outside through separate conductive pads. According to an embodiment of the disclosure, the flexible printed circuit board 300 may include a first cutoff portion 321 where the first conductive layer 320 is electrically disconnected, at the first bending portion F1. According to an embodiment of the disclosure, the first cutoff portion 321 may include a conductive layer removal region in which the first conductive layer 320 is omitted. According to an embodiment of the disclosure, the first cutoff portion 321 may at least partially overlap the first connection part C1 when the flexible printed circuit board 300 is viewed from above. According to an embodiment of the disclosure, the cut length d of the first cutoff portion 321 formed in the direction of the linkage part C2 from the first connection part C1 may be determined by the degree of bending of the first bending portion F1. For example, the cut length d of the first cutoff portion 321 may increase as the degree of bending (e.g., a bending angle) of the first bending portion F1 increases. According to an embodiment of the disclosure, the plurality of second conductive terminals 360 may be electrically connected to the second conductive layer 330 through at least one first conductive via 311 disposed on the dielectric substrate 310, in the first connection part C1.

According to various embodiments of the disclosure, the flexible printed circuit board 300 may include an electrical connector 370, which is disposed on the first cover layer 3201 and is electrically connected to the plurality of first conductive terminals 350 and/or the plurality of second conductive terminals 360, in the first connection part C1. According to an embodiment of the disclosure, when the electrical connector 370 is connected to the second printed circuit board 120, the plurality of second conductive terminals 360 may be electrically connected to the first printed circuit board (e.g., the first printed circuit board 130 in FIG. 3) through the at least one first conductive via 311 and the second conductive layer 330 extended seamlessly from the first connection part C1 to the linkage part C2.

According to various embodiments of the disclosure, the flexible printed circuit board 300 may include a photosensitizer layer 341 (e.g., photo solder resist (PSR) layer) disposed on the second cover layer 3301 in the first connection part C1. According to an embodiment of the disclosure, the photosensitizer layer 341 may be used as a member for reinforcing the rigidity of the corresponding region (e.g., first connection part C1) of the flexible printed circuit board 300. According to an embodiment of the disclosure, the flexible printed circuit board 300 may include a rigidity reinforcing layer (stiffener) 342 stacked on the photosensitizer layer 341. According to an embodiment of the disclosure, the rigidity reinforcing layer 342 may include an epoxy made of a non-conductive material that is formed to have rigidity when it is applied to the first connection part C1 of the flexible printed circuit board 300 and then cured or solidified. In another embodiment of the disclosure, the rigidity reinforcing layer 342 may include a pre-cured epoxy bonded to the first connection part C1 of the flexible printed circuit board 300. According to an embodiment of the disclosure, the rigidity reinforcing layer 342 may include a tape member having a rigidity of a dielectric material attached to the first connection part C1 of the flexible printed circuit board 300.

According to an embodiment of the disclosure, in the flexible printed circuit board 300, the first conductive layer 320, which is close to the bending direction (direction (1)) and in which the stress is the most concentrated at the first bending portion F1, is omitted and is formed as a cutoff portion 321, so that disconnection of the first conductive layer 320 due to the bending of the bending portion F1 may be prevented, and improved bending characteristics of the linkage part C2 may be provided at the first bending portion F1. According to various embodiments of the disclosure, the plurality of first conductive terminals 350 may be electrically disconnected from the first conductive layer 320, and the plurality of second conductive terminals 360 may be connected to the second conductive layer 330 through at least one first conductive via 311, so that electrical connections may be replaced.

According to various embodiments of the disclosure, at least one conductive terminal among the plurality of first conductive terminals 350 that are electrically disconnected through the first cutoff portion 321 may be, in the first connection part C1, electrically connected to at least one conductive terminal among the plurality of second conductive terminals 360 through the first conductive layer 320. In this case, the at least one first conductive terminal electrically connected to the at least one second conductive terminal through the first conductive layer 320 may include a grounding terminal and/or a signal transmission terminal.

According to various embodiments of the disclosure, due to the first cutoff portion 321, the plurality of first conductive terminals 350 or the plurality of second conductive terminals 360 may be electrically connected to the second conductive layer 330 through the at least one conductive via 311 formed in a direction away from the first bending portion F1 from the plurality of first conductive terminals 350 (e.g., between the plurality of first conductive terminals 350 and the plurality of second conductive terminals 360 in the first connection part C1). The first connection part C1 and the second connection part (e.g., the second connection part C3 in FIG. 5) may be electrically connected by use of the second conductive layer 330 of the first bending portion F1.

According to various embodiments of the disclosure, as shown in FIG. 6B, the flexible printed circuit board 300 may further include at least one grounding terminal disposed on the left and right of the plurality of first conductive terminals 350. According to an embodiment of the disclosure, this at least one grounding terminal may also be arranged to include a cutoff portion 321.

Figure 7:
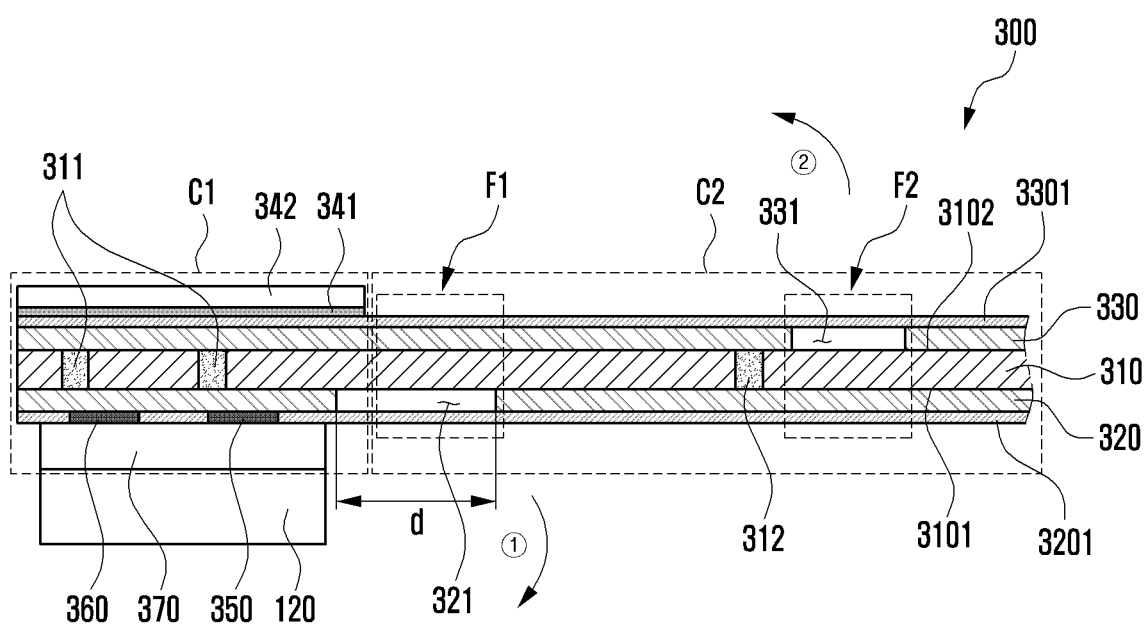
FIG. 7 is a partial cross-sectional view of a flexible printed circuit board according to an embodiment of the disclosure.

FIG. 7 is a partial cross-sectional view of a flexible printed circuit board according to an embodiment of the disclosure.

In describing the flexible printed circuit board 300 of FIG. 7, the same reference numerals are assigned to the elements substantially the same as those of the flexible printed circuit board 300 of FIG. 6A, and detailed descriptions thereof may be omitted.

Referring to FIG. 7, the flexible printed circuit board 300 may include a pair of bending portions F1 and F2 spaced apart from each other in the linkage part C2. According to an embodiment of the disclosure, the flexible printed circuit board 300 may include, at the first bending portion F1, a first cutoff portion 321 where at least some of the first conductive layer 320 is omitted. According to an embodiment of the disclosure, the flexible printed circuit board 300 may include, at the second bending portion F2, a second cutoff portion 331 where at least some of the second conductive layer 330 is omitted. According to an embodiment of the disclosure, the first cutoff portion 321 may be formed by omitting, at the first bending portion F1, the first conductive layer 320 where the stress is the most concentrated according to the deformation of the linkage part C2 that is being bent in a downward direction (direction (1). The second cutoff portion 331 may be formed by omitting, at the second bending portion F2, the second conductive layer 330 where the stress is the most concentrated according to the deformation of the linkage part C2 that is being bent in an upward direction (direction (2)). According to an embodiment of the disclosure, the flexible printed circuit board 300 may include at least one second conductive via 312, which is formed on the dielectric substrate 310 to electrically connect the first conductive layer 320 and the second conductive layer 330, between the first bending portion F1 and the second bending portion F2 of the linkage part C2. Hence, an electrical signal from the first electrical connector 370 may be delivered to the first printed circuit board (e.g., first printed circuit board 130 in FIG. 3) through the plurality of second conductive terminals 360, the at least one first conductive via 311, the second conductive layer 330, the at least one second conductive via 312, and the first conductive layer 320.

Although not shown, even if a bending portion with two or multiple bendings is formed in the linkage part C2, it is possible to help improve the flexibility of the flexible printed circuit board 300 by forming a cutoff portion at which a part of the conductive layer is removed as described above.

According to various embodiments of the disclosure, an electronic device (e.g., the electronic device 100 in FIG. 3) may include a housing (e.g., the housing 110 in FIG. 3), a first printed circuit board (e.g., the first printed circuit board 130 in FIG. 3) disposed in the internal space (e.g., the internal space 1001 in FIG. 3) of the housing, a second printed circuit board (e.g., the second printed circuit board 120 in FIG. 3) disposed to be spaced apart from the first printed circuit board, and a flexible printed circuit board (e.g., the flexible printed circuit board 300 in FIG. 6A) that electrically connects the first printed circuit board and the second printed circuit board, and includes a connection part (e.g., the first connection part C1 in FIG. 6A) connected to the second printed circuit board, and a linkage part (e.g., the linkage part C2 in FIG. 6A) extended from the connection part and including a bending portion (e.g., first bending portion F1 in FIG. 6A) being at least partially bendable, the flexible printed circuit board including a dielectric substrate (e.g., the dielectric substrate 310 in FIG. 6A), a first conductive layer (e.g., the first conductive layer 320 in FIG. 6A) disposed on a first surface (e.g., the first surface 3101 in FIG. 6A) of the dielectric substrate, a first cover layer (e.g., the first cover layer 3201 in FIG. 6A) disposed on the first conductive layer, a second conductive layer (e.g., the second conductive layer 330 in FIG. 6A) disposed on a second surface (e.g., 3102 in FIG. 6A) opposite to the first surface of the dielectric substrate, a second cover layer (e.g., the second cover layer 3301 in FIG. 6A) disposed on the second conductive layer, a plurality of first conductive terminals (e.g., a plurality of first conductive terminals 350 in FIG. 6A), in the connection part, exposed through the first cover layer and electrically connected to the first conductive layer, and a plurality of second conductive terminals (e.g., a plurality of second conductive terminals 360 in FIG. 6A), in the connection part, exposed through the first cover layer, electrically connected to the first conductive layer, and disposed at a greater distance from the bending portion than the plurality of first conductive terminals, wherein the first conductive layer may include, at the bending portion, a cutoff portion (e.g., the first cutoff portion 321 in FIG. 6A) at which the first conductive layer is electrically disconnected, and wherein the plurality of second conductive terminals may be electrically connected to the second conductive layer, in the connection part, through at least one conductive via formed through the dielectric substrate.

According to various embodiments of the disclosure, the electronic device may include, in the connection part, an electrical connector (e.g., the electrical connector 370 in FIG. 6A) that is disposed on the first cover layer and is electrically connected to the plurality of first conductive terminals and/or the plurality of second conductive terminals.

According to various embodiments of the disclosure, the electronic device may include, in the connection part, a photosensitizer layer (PSR layer) (e.g., the photosensitizer layer 341 in FIG. 6A) disposed on the second cover layer.

According to various embodiments of the disclosure, the electronic device may further include, in the connection part, a rigidity reinforcing layer (stiffener) (e.g., the rigidity reinforcing layer 342 in FIG. 6A) disposed on the second cover layer.

According to various embodiments of the disclosure, the rigidity reinforcing layer may include an epoxy or tape member that is applied to the second cover layer and then cured or is disposed on the second cover layer in a cured state.

According to various embodiments of the disclosure, the cutoff portion may at least partially overlap the connection part when the flexible printed circuit board is viewed from above.

According to various embodiments of the disclosure, the cutoff portion may include a region in which the first conductive layer is omitted.

According to various embodiments of the disclosure, the cut length of the cutoff portion formed in a direction of the linkage part from the connection part may be determined according to the degree of bending of the bending portion.

According to various embodiments of the disclosure, at least one of the plurality of first conductive terminals may be electrically connected to at least one of the plurality of second conductive terminals, in the connection part, through the first conductive layer.

According to various embodiments of the disclosure, the at least one of the plurality of second conductive terminals electrically connected to the at least one of the plurality of first conductive terminals may include a grounding terminal.

According to various embodiments of the disclosure, the electronic device may further include at least one sensor module (e.g., a camera module 102 in FIG. 3) disposed on the second printed circuit board.

According to various embodiments of the disclosure, the at least one sensor module may include at least one of proximity sensor module, a fingerprint sensor module, a gesture sensor module, a gyro sensor module, a barometric pressure sensor module, a temperature sensor module, a humidity sensor module, a magnetic sensor module, an acceleration sensor module, a grip sensor module, an illuminance sensor module, an infrared sensor module, a color sensor module, an ultrasonic sensor module, an iris sensor module, a biometric sensor module, a camera module, a time-of-flight (TOF) sensor module, or a light detection and ranging (LiDAR) scanner.

According to various embodiments of the disclosure, the first printed circuit board may include a main board of the electronic device.

According to various embodiments of the disclosure, the linkage part may be bent, at the bending portion, in a direction where the cutoff portion has an inner radius of curvature.

According to various embodiments of the disclosure, the electronic device may include a display (e.g., the display 101 in FIG. 3) that is disposed in the internal space so as to be visible from the outside through at least some of the housing.

According to various embodiments of the disclosure, a flexible printed circuit board (e.g., the flexible printed circuit board 300 in FIG. 6A), which includes a connection part (e.g., the first connection part C1 in FIG. 6A) connected to a printed circuit board (e.g., the second printed circuit board 120 in FIG. 6A), and a linkage part (e.g., the linkage part C2 in FIG. 6A) extended from the connection part and including a bending portion (e.g., the first bending portion F1 in FIG. 6A) being at least partially bendable, may include a dielectric substrate (e.g., the dielectric substrate 310 in FIG. 6A), a first conductive layer (e.g., the first conductive layer 320 in FIG. 6A) disposed on a first surface (e.g., the first surface 3101 in FIG. 6A) of the dielectric substrate, a first cover layer (e.g., the first cover layer 3201 in FIG. 6A) disposed on the first conductive layer, a second conductive layer (e.g., the second conductive layer 330 in FIG. 6A) disposed on a second surface (e.g., 3102 in FIG. 6A) opposite to the first surface of the dielectric substrate, a second cover layer (e.g., the second cover layer 3301 in FIG. 6A) disposed on the second conductive layer, a plurality of first conductive terminals (e.g., a plurality of first conductive terminals 350 in FIG. 6A), in the connection part, exposed through the first cover layer and electrically connected to the first conductive layer, and a plurality of second conductive terminals (e.g., a plurality of second conductive terminals 360 in FIG. 6A), in the connection part, exposed through the first cover layer, electrically connected to the first conductive layer, and disposed at a greater distance from the bending portion than the plurality of first conductive terminals, wherein the first conductive layer may include, at the bending portion, a cutoff portion (e.g., the first cutoff portion 321 in FIG. 6A) at which the first conductive layer is electrically disconnected, and wherein the plurality of second conductive terminals may be electrically connected to the second conductive layer, in the connection part, through at least one conductive via formed through the dielectric substrate.

According to various embodiments of the disclosure, the cutoff portion may at least partially overlap the connection part when the flexible printed circuit board is viewed from above.

According to various embodiments of the disclosure, the cutoff portion may include a region in which the first conductive layer is omitted.

According to various embodiments of the disclosure, the cut length of the cutoff portion formed in a direction of the linkage part from the connection part may be determined according to the degree of bending of the bending portion.

According to various embodiments of the disclosure, the linkage part may be bent, at the bending portion, in a direction where the cutoff portion has an inner radius of curvature.

While the disclosure has been shown and described with reference to various embodiments thereof, it will be understood by those skilled in the art that various changes in form and details may be made therein without departing from the spirit and scope of the disclosure as defined by the appended claims and their equivalents.

What is claimed is:

1. An electronic device comprising: a housing; a printed circuit board disposed in the housing; and a flexible printed circuit board electrically connected with the printed circuit board, the flexible printed circuit board, in a top view thereof, including a connection part overlapped with and, at least partially, physically connected with the printed circuit board and a linkage part extended from the connection part, the flexible printed circuit board, including: a dielectric substrate; one or more first conductive layers disposed over the dielectric substrate in a first direction, the one or more first conductive layers including a first region in which, at least, a portion of the one or more first conductive layer is removed, the first region at least partially overlapped with the connection part; a first cover layer disposed over the one or more first conductive layers in the first direction; one or more second conductive layers disposed over the dielectric substrate in a second direction opposite to the first direction, the one or more second conductive layers including a second region in which, at least, a portion of the one or more second conductive layers is removed, the second region formed as spaced apart from the first region in a length direction of the linkage part; and a second cover layer disposed over the one or more second conductive layers in the second direction, wherein at least one conductive layer of the one or more first conductive layers or the one or more second conductive layers includes: a third region in which, at least, a portion of the at least one conductive layer is removed, the third region not overlapped with the connection part.

2. The electronic device of claim 1, wherein the third region is formed as spaced apart from the first region and the second region in the length direction of the linkage part.

3. The electronic device of claim 1, wherein the connection part includes:
a first set of one or more conductive terminals and a second set of one or more conductive terminals formed through the first cover layer as electrically connected with at least one of the one or more first conductive layers, the second set of one or more conductive terminals disposed at a greater distance from the second region than the first set of one or more conductive terminals.

4. The electronic device of claim 1, wherein the first region and the second region form at least part of a first bending portion and a second bending portion of the flexible printed circuit board, respectively.

5. The electronic device of claim 1,
wherein the one or more first conductive layers includes a first copper portion and the one or more second conductive layers includes a second copper portion, and
wherein the first region and the second region are formed in the first copper portion and the second copper portion, respectively.

6. The electronic device of claim 1, wherein the connection part includes a rigidity reinforcing layer disposed on the second cover layer.

7. The electronic device of claim 6, wherein the rigidity reinforcing layer includes an epoxy member or a tape member applied to the second cover layer.

8. The electronic device of claim 1, wherein the connection part includes a photosensitizer (PSR) layer disposed on the second cover layer.

9. A flexible printed circuit board including a connection part and a linkage part extended from the connection part, the flexible printed circuit board comprising: a dielectric substrate; one or more first conductive layers disposed over the dielectric substrate in a first direction, the one or more first conductive layers including a first region in which, at least, a portion of the one or more first conductive layer is removed, the first region at least partially overlapped with the connection part; a first cover layer disposed over the one or more first conductive layers in the first direction; one or more second conductive layers disposed over the dielectric substrate in a second direction opposite to the first direction, the one or more second conductive layers including a second region in which, at least, a portion of the one or more second conductive layers is removed, the second region formed as spaced apart from the first region in a length direction of the linkage part; and a second cover layer disposed over the one or more second conductive layers in the second direction, wherein at least one conductive layer of the one or more first conductive layers or the one or more second conductive layers includes: a third region in which, at least, a portion of the at least one conductive layer is removed, the third region not overlapped with the connection part.

10. The flexible printed circuit board of claim 9, wherein the third region is formed as spaced apart from the first region and the second region in the length direction of the linkage part.

11. The flexible printed circuit board of claim 9, wherein the connection part includes:
a first set of one or more conductive terminals and a second set of one or more conductive terminals formed through the first cover layer as electrically connected with at least one of the one or more first conductive layers, the second set of one or more conductive terminals disposed at a greater distance from the second region than the first set of one or more conductive terminals.

12. The flexible printed circuit board of claim 9, wherein the first region and the second region form at least part of a first bending portion and a second bending portion of the flexible printed circuit board, respectively.

13. The flexible printed circuit board of claim 9,
wherein the one or more first conductive layers includes a first copper portion and the one or more second conductive layers includes a second copper portion, and
wherein the first region and the second region are formed in the first copper portion and the second copper portion, respectively.

14. The flexible printed circuit board of claim 9, wherein the connection part includes a rigidity reinforcing layer disposed on the second cover layer.

15. The flexible printed circuit board of claim 14, wherein the rigidity reinforcing layer includes an epoxy member or a tape member applied to the second cover layer.

16. The flexible printed circuit board of claim 9, wherein the connection part includes a photosensitizer (PSR) layer disposed on the second cover layer.

* * * * *